US010165642B2

(12) United States Patent
Gotou et al.

(10) Patent No.: US 10,165,642 B2
(45) Date of Patent: Dec. 25, 2018

(54) DIMMING DEVICE (71) Applicant: Panasonic Intellectual Property Management Co., Ltd., Osaka (JP)

(72) Inventors: Kiyosi Gotou, Hyogo (JP); Tomohiro Miyake, Mie (JP); Eiichirou Niikura, Mie (JP); Kengo Miyamoto, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/740,370

(22) PCT Filed: Jun. 28, 2016

(86) PCT No.: PCT/JP2016/003097
§ 371 (c)(1),
(2) Date: Dec. 28, 2017

(87) PCT Pub. No.: WO2017/006539
PCT Pub. Date: Jan. 12, 2017

(65) Prior Publication Data
US 2018/0192490 A1  Jul. 5, 2018

(30) Foreign Application Priority Data

Jul. 3, 2015 (JP) ................. 2015-134721

(51) Int. Cl.
H05B 33/08 (2006.01)
H05B 37/02 (2006.01)
(Continued)

(52) U.S. Cl.
CPC .......... *H05B 33/0845* (2013.01); *H02M 1/08* (2013.01); *H02M 1/083* (2013.01);
(Continued)

(58) Field of Classification Search
CPC ............ H05B 33/0815; H05B 33/0845; H05B 39/041; H05B 33/0818; H05B 41/19;
(Continued)

(56) References Cited

U.S. PATENT DOCUMENTS 7,546,473 B2 * 6/2009 Newman ............... H05B 39/044
                                              323/208
7,872,423 B2 * 1/2011 Biery ................... H05B 39/041
                                              315/149
(Continued)

FOREIGN PATENT DOCUMENTS

JP 2002-009598 A 1/2002
JP 2012-186998 A 9/2012
(Continued)

OTHER PUBLICATIONS

International Search Report and Written Opinion for International Application No. PCT/JP2016/003097.
Extended/Supplementary European Search Report for EP16821016.

*Primary Examiner* — Vibol Tan
(74) *Attorney, Agent, or Firm* — Renner, Otto, Boisselle & Sklar, LLP (57) ABSTRACT A signal source generates a drive signal according to a dimming level. A discharge part includes a series circuit having a Zener diode and a rectifier element connected in series. The series circuit enables passage of a reverse current of the Zener diode. In the discharge part, the series circuit is electrically connected between a control terminal and the signal source to enable the reverse current of the Zener diode to flow from the control terminal to the signal source.

19 Claims, 8 Drawing Sheets (51) Int. Cl.
*H02M 1/08* (2006.01)
*H03K 17/0412* (2006.01)
*H03K 17/687* (2006.01)
*H02M 7/25* (2006.01)
*H02M 1/00* (2006.01)

(52) U.S. Cl.
CPC .......... *H02M 7/25* (2013.01); *H03K 17/0412* (2013.01); *H03K 17/687* (2013.01); *H05B 33/0815* (2013.01); *H05B 37/02* (2013.01); *H02M 2001/0029* (2013.01); *H02M 2001/0054* (2013.01); *H03K 17/04123* (2013.01); *Y02B 20/42* (2013.01); *Y02B 20/46* (2013.01)

(58) Field of Classification Search
CPC ................ H05B 41/22; H05B 41/2827; H05B 41/2824; H05B 41/2822; H05B 41/2821; H05B 41/00; H05B 37/02; H05B 39/02; H05B 39/04; H05B 41/30; Y02B 20/146; Y02B 20/346; Y02B 20/46; Y02B 20/342; Y02B 20/42; H02M 1/083; H02M 7/25; H02M 1/08; H02M 2001/0029; H02M 2001/0054; H03K 17/0412; H03K 17/687; H03K 17/04123

See application file for complete search history.

(56) References Cited

U.S. PATENT DOCUMENTS

| | | | | |
|---|---|---|---|---|
| 8,294,379 | B2* | 10/2012 | Liu | H05B 33/0809 |
| | | | | 315/224 |
| 8,310,166 | B2* | 11/2012 | Nagaoka | H05B 41/2821 |
| | | | | 315/209 R |
| 8,327,159 | B2* | 12/2012 | Newman, Jr. | H05B 39/044 |
| | | | | 315/349 |
| 8,892,913 | B2* | 11/2014 | Newman, Jr. | H05B 39/044 |
| | | | | 315/315 |
| 2012/0230073 | A1 | 9/2012 | Newman, Jr. et al. | |
| 2013/0187563 | A1 | 7/2013 | Sasai et al. | |
| 2013/0278300 | A1 | 10/2013 | Domingo et al. | |

FOREIGN PATENT DOCUMENTS

| | | |
|---|---|---|
| JP | 2013-149498 A | 8/2013 |
| JP | 2013-251189 A | 12/2013 |

\* cited by examiner

DIMMING DEVICE

TECHNICAL FIELD

The present invention relates to a dimming device for dimming an illumination load.

BACKGROUND ART

A dimming device for dimming an illumination load is known (e.g., Patent Literature 1).

The dimming device described in Patent Literature 1 includes a pair of terminals, a control circuit, a control power supply configured to supply control electric power to the control circuit, and a dimming operation section configured to set the dimming level of the illumination load.

Between the pair of terminals, the control circuit and the control power supply are connected in parallel to each other. Moreover, between the pair of terminals, a series circuit of an alternating current (AC) power supply and an illumination load is connected. The illumination load includes a plurality of light emitting diode (LED) devices and a power supply circuit configured to light the LED devices. The power supply circuit includes a smoothing circuit of a diode and an electrolytic capacitor.

The control circuit includes a switch which enables phase control of an AC voltage to be supplied to the illumination load, a switch driver configured to drive the switch, and a controller configured to control the switch driver and the control power supply.

The control power supply is connected in parallel to the switch. The control power supply converts the AC voltage of the AC power supply into control electric power. The control power supply includes an electrolytic capacitor configured to store the control electric power.

The controller is supplied with the control electric power from the control power supply via the electrolytic capacitor. The controller includes a microcomputer. The microcomputer performs reverse phase control in accordance with a dimming level set by the dimming operation section to interrupt power supply to the illumination load during a time period of each of half cycles of the AC voltage.

CITATION LIST

Patent Literature

[Patent Literature 1] JP 2013-149498 A

SUMMARY OF INVENTION

It is an object of the present invention to provide a dimming device which is compatible with an increased number of types of illumination loads.

A dimming device according to an aspect of the present invention includes a pair of input terminals, a switching device an inputter, a signal source, and a discharge part. The pair of input terminals is electrically connected between an illumination load and an AC power supply. The switching device includes a control terminal and is configured to switch between non-conduction and conduction of a bidirectional current between the pair of input terminals depending on whether or not a voltage applied to the control terminal is higher than or equal to a threshold voltage. The inputter is configured to receive a dimming level specifying a magnitude of a light output of the illumination load. The signal source is configured to generate a drive signal according to the dimming level. The discharge part includes a series circuit having a Zener diode and a rectifier element connected in series. The series circuit enables passage of a reverse current of the Zener diode. The series circuit is electrically connected between the control terminal and the signal source to enable the reverse current to flow from the control terminal to the signal source.

DESCRIPTION OF EMBODIMENTS

First Embodiment
(1.1) Configuration

Figure 1:
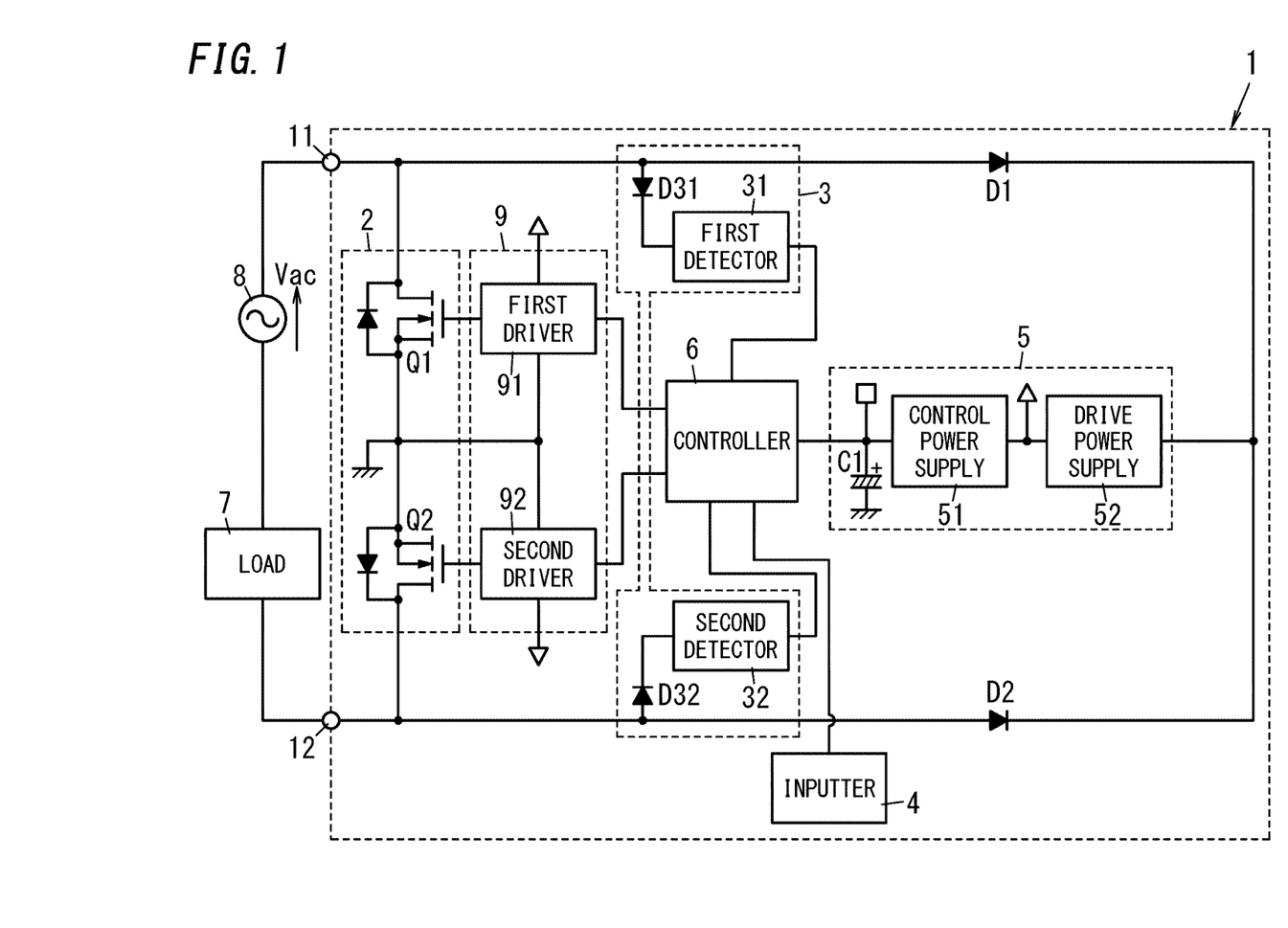
FIG. 1 is a circuit diagram schematically illustrating a configuration of a dimming device according to a first embodiment.
Figure 2:
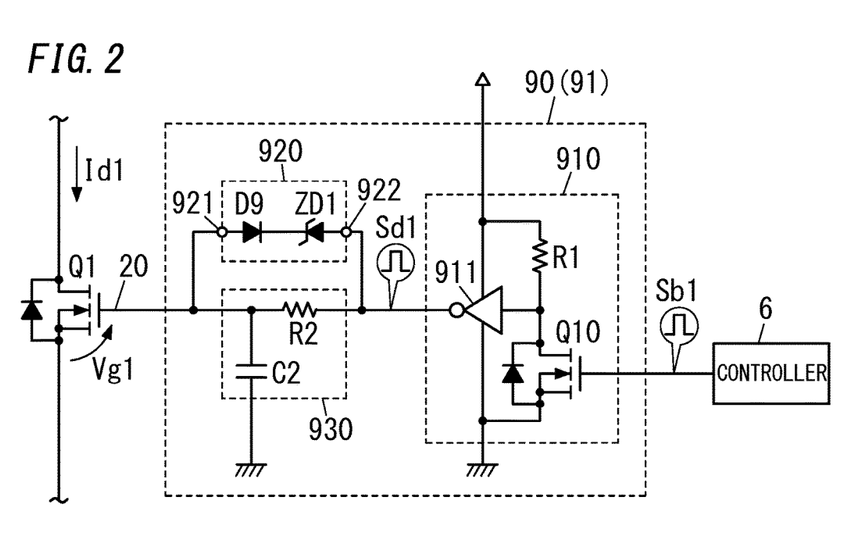
FIG. 2 is a circuit diagram schematically illustrating a configuration of a driver of the dimming device according to the first embodiment.

The following configurations are mere examples of the present invention. The present invention is not limited to the following embodiments. Even in embodiments other than these embodiments, various modifications may be made depending on design and the like without departing from the technical idea of the present invention. As illustrated in FIG. 1, a dimming device 1 of the present embodiment includes a pair of input terminals 11 and 12, a bidirectional switch 2 (switching devices Q1 and Q2), a phase detector 3, an inputter 4, a power supply 5, a controller 6, a switch driver 9, and diodes D1 and D2. The switch driver 9 includes a first driver 91 and a second driver 92. As illustrated in FIG. 2, each of the first driver 91 and the second driver 92 includes a signal source 910, a discharge part 920, and a filter circuit 930.

The pair of input terminals 11 and 12 is electrically connected between an illumination load (hereinafter simply referred to as a "load") 7 and an AC power supply 8. The switching devices Q1 and Q2 are configured to switch between non-conduction and conduction of a current between the pair of input terminals 11 and 12. The inputter 4 receives a dimming level specifying a magnitude of a light output of the load 7.

Each signal source 910 generates a drive signal Sd1 according to the dimming level. Each discharge part 920 includes a series circuit having a Zener diode ZD1 and a rectifier element D9 connected in series. The series circuit enables passage of a reverse current of the Zener diode ZD1.

In each discharge part 920, the series circuit is electrically connected between a control terminal 20 and a corresponding one of the signal sources 910 to enable the reverse current (of the Zener diode ZD1) to flow from the control terminal 20 to the corresponding one of the signal sources 910.

The "terminal" mentioned herein may not have an entity as a part (terminal) to which an electric wire or the like is to be connected, but the "terminal" may be, for example, a lead of an electronic component, or a pail of a conductor included in a circuit board.

The dimming device 1 is a two-wire dimming device and is used electrically connected in series to the load 7 with respect to the AC power supply 8. The load 7 is lit when supplied with electric power. The load 7 includes an LED device as a light source and a lighting circuit configured to light the LED device. The AC power supply 8 is, for example, a commercial power supply having a single phase 100 V and 60 [Hz]. The dimming device 1 is applicable to, for example, a wall switch.

The bidirectional switch 2 is configured to switch between non-conduction and conduction of a bidirectional current between the input terminals 11 and 12. The bidirectional switch 2 includes, for example, two devices, namely the first switching device Q1 and the second switching device Q2 electrically connected in series between the input terminals 11 and 12. For example, each of the switching devices Q1 and Q2 is a semiconductor switching device including an enhancement n-channel metal-oxide-semiconductor field effect transistor (MOSFET). That is, each of the switching devices Q1 and Q2 includes the control terminal 20 (see FIG. 2) including a gate and is turned on/off depending on whether or not a voltage applied to the control terminal 20 is higher than or equal to a threshold voltage Vth1 (see FIG. 4).

The switching devices Q1 and Q2 are connected in a so-called anti-series connection between the input terminals 11 and 12. That is, the sources of the switching devices Q1 and Q2 are connected to each other. The drain of the switching device Q1 is connected to the input terminal 11, and the drain of the switching device Q2 is connected to the input terminal 12. The sources of both of the switching devices Q1 and Q2 are connected to ground of the power supply 5. The ground of the power supply 5 is a reference potential for an internal circuit of the dimming device 1.

The bidirectional switch 2 is capable of switching among four states by a combination of on and off of the switching devices Q1 and Q2. The four states include a bidirectionally off state where both the switching devices Q1 and Q2 are off, a bidirectionally on state where both the switching devices Q1 and Q2 are on, and two kinds of unidirectionally on states: a case where only the switching device Q1 is on and a case where only the switching device Q2 is on. In a unidirectionally on state, unidirectional conduction is established between the pair of input terminals 11 and 12, from one of the switching devices Q1 and Q2 which is on, through a parasitic diode of the other of the switching devices Q1 and Q2 which is off. For example, when the switching device Q1 is on and the switching device Q2 is off, a first unidirectionally on state where a current flows from the input terminal 11 toward the input terminal 12 is achieved. Alternatively, when the switching device Q2 is on and the switching device Q1 is off, a second unidirectionally on state where a current flows from the input terminal 12 toward the input terminal 11 is achieved. Thus, when an AC voltage Vac is applied from the AC power supply 8 between the input terminals 11 and 12, in a positive polarity of the AC voltage Vac, that is, in a half period in which the input terminal 11 has a high potential, the first unidirectionally on state is a "forward on state", and the second unidirectionally on state is a "reverse on state". On the other hand, in a negative polarity of the AC voltage Vac, that is, in a half period in which the input terminal 12 has the high potential, the second unidirectionally on state is the "forward on state", and the first unidirectionally on state is the "reverse on state".

Here, the bidirectional switch 2 is in an on state in both the "bidirectionally on state" and the "forward on state", and is in an off state in both the "bidirectionally off state" and the "reverse on state".

The phase detector 3 detects the phase of the AC voltage Vac applied between the input terminals 11 and 12. The "phase" mentioned herein includes a zero crossing point of the AC voltage Vac and the polarity (positive polarity, negative polarity) of the AC voltage Vac. The phase detector 3 is configured to output a detection signal to the controller 6 when the phase detector 3 detects the zero crossing point of the AC voltage Vac. The phase detector 3 includes a diode D31, a first detector 31, a diode D32, and a second detector 32. The first detector 31 is electrically connected to the input terminal 11 via the diode D31. The second detector 32 is electrically connected to the input terminal 12 via the diode D32. The first detector 31 detects a zero crossing point when the AC voltage Vac transitions from a negative half period to a positive half period. The second detector 32 detects a zero crossing point when the AC voltage Vac transitions from the positive half period to the negative half period.

That is, the first detector 31 determines the zero crossing point when detecting a transition from a state where a voltage with the input terminal 11 having a high electric potential is lower than a specified value to a state where the voltage with the input terminal 11 having the high electric potential is higher than or equal to the specified value. Similarly, the second detector 32 determines the zero crossing point when detecting a transition from a state where a voltage with the input terminal 12 having a high electric potential is lower than a specified value to a state where the voltage with the input terminal 12 having a high electric potential is higher than or equal to the specified value. The specified value is a value (an absolute value) set close to 0 V. For example, the specified value of the first detector 31 is a value as high as several volts, and the specified value of the second detector 32 is a value as high as several volts. Thus, detection points at which the zero crossing points are detected by the first detector 31 and the second detector 32 are a little later than the zero crossing points (0 V) in a strict sense.

The inputter 4 receives a signal denoting the dimming level from an operation section operated by a user and outputs the signal as a dimming signal to the controller 6. The inputter 4 may process the received signal or does not have to process the received signal to output the dimming signal. The dimming signal corresponds to a numerical value or the like specifying the magnitude of the light output of the load 7 and may include an "off level" at which the load 7 is in a non-lighting state. The operation section is only required to be configured to be operated by a user to output a signal denoting the dimming level to the inputter 4. The operation section may be, for example, a variable resistor, a rotary switch, a touch panel, a remote controller, or a communication terminal such as a smartphone.

The controller 6 controls the bidirectional switch 2 on the basis of the detection signal from the phase detector 3 and the dimming signal from the inputter 4. The controller 6 individually controls the switching devices Q1 and Q2. Specifically, the controller 6 controls the switching device Q1 by a first control signal and controls the switching device Q2 by a second control signal.

The controller 6 includes, for example, a microcomputer as a main configuration. The microcomputer executes a program stored in memory of the microcomputer by a central processing unit (CPU) to realize a function as the controller 6. The program may be stored in the memory of the microcomputer in advance, may be provided as a recording medium such as a memory card storing the program, or may be provided via an electronic communication network. In other words, the program is a program which causes a computer embodiment the microcomputer) to function as the controller 6.

The switch driver 9 includes the first driver 91 configured to drive (perform on/off control of) the switching device Q1 and the second driver 92 configured to drive (perform on/off control of) the switching device Q2. The first driver 91 receives the first control signal from the controller 6 to apply a gate voltage Vg1 (see FIG. 2) to the switching device Q1. In this way, the first driver 91 performs the on/off control of the switching device Q1. Similarly, the second driver 92 receives the second control signal from the controller 6 to apply the gate voltage Vg1 to the switching device Q2. In this way, the second driver 92 performs the on/off control of the switching device Q2. The first driver 91 generates the gate voltage Vg1 with reference to the potential of the source of the switching device Q1. The same applies to the second driver 92.

The power supply 5 includes a control power supply 51 configured to generate control electric power, a drive power supply 52 configured to generate drive electric power, and a capacitive element (capacitor) C1. The control electric power is electric power for operating the controller 6. The drive electric power is electric power for driving the switch driver 9. The capacitive element C1 is electrically connected to an output terminal of the control power supply 51 and is charged with an output current of the control power supply 51.

The power supply 5 is electrically connected to the input terminal 11 via the diode D1 and is electrically connected to the input terminal 12 via the diode D2. Thus, a diode bridge including the pair of diodes D1 and D2 and parasitic diodes of the switching devices Q1 and Q2 performs full-wave rectification of the AC voltage Vac applied between the input terminals 11 and 12, and the full-wave rectified AC voltage Vac is then supplied to the power supply 5. The drive power supply 52 smooths the full-wave rectified AC voltage Vac to generate the drive electric power. The drive power supply 52 supplies the drive electric power to the switch driver 9 and the control power supply 51. The drive electric power is, for example, 10 V. The control power supply 51 steps down the drive electric power supplied from the drive power supply 52 to generate the control electric power and outputs the control electric power to the capacitive element C1. The control electric power is, for example, 3 V. The control power supply 51 may generate the control electric power directly from the full-wave rectified AC voltage Vac without using the drive power supply 52. That is, the power supply 5 is supplied with electric power from the AC power supply 8 to generate the control electric power and the drive electric power.

The lighting circuit of the load 7 reads a dimming level from the waveform of the AC voltage Vac phase-controlled by the dimming device 1 to vary the magnitude of the light output of the LED device. Here, the lighting circuit includes, for example, a circuit for securing a current such as a bleeder circuit. Thus, also during a time period during which the bidirectional switch 2 of the dimming device 1 is non-conductive, a current is allowed to pass through the load 7.

(1.2) Operation

Figure 3:
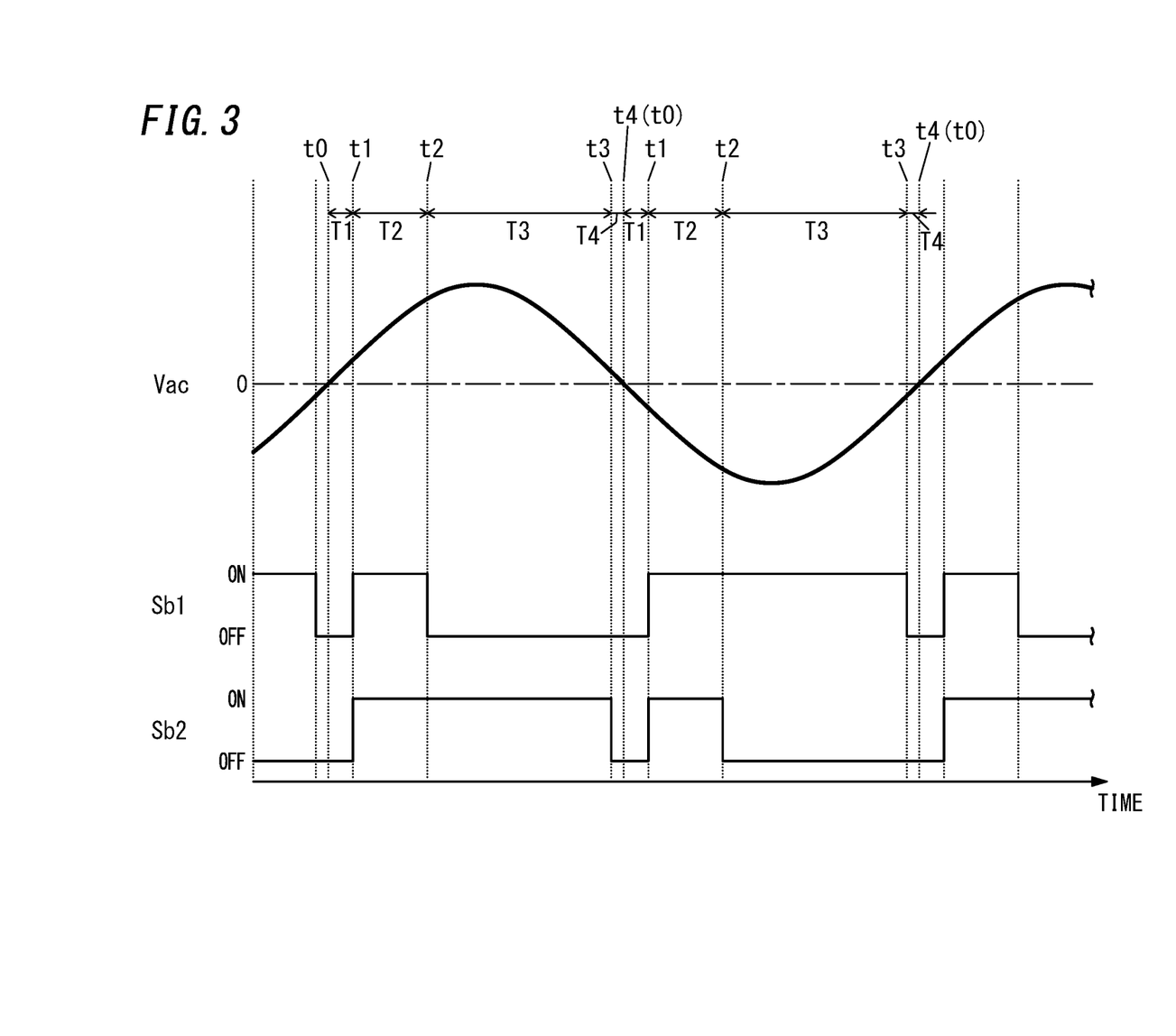
FIG. 3 is a timing chart illustrating operation of the dimming device according to the first embodiment.

Dimming operation of the dimming device 1 of the present embodiment will be described with reference to FIG. 3. FIG. 3 shows the AC voltage "Vac", the first control signal "Sb1", and the second control signal "Sb2".

First, the operation of the dimming device 1 during a positive half period of the AC voltage Vac is described. The dimming device 1 detects the zero crossing point of the AC voltage Vac by the phase detector 3. The zero crossing point serves as a reference for phase control. The first detector 31 outputs a first detection signal when the AC voltage Vac reaches a positive specified value in the course of a transition of the AC voltage Vac from a negative half period to the positive half period. In the present embodiment, a time point at which the first detection signal is generated is a "detection point", and a sum of: a time period from a starting time point (zero crossing point) t0 of the half period to the detection point; and a time period from the detection point until a lapse of a definite time (e.g., 300 μs) is a first time period T1. During the first time period T1 from the starting time point (zero crossing point) t0 of the half period to a first time point t1 after a lapse of a first time, the controller 6 controls such that the first control signal Sb1 and the second control signal Sb2 are "off" signals. Thus, during the first time period T1, both the switching devices Q1 and Q2 are off, and the bidirectional switch is in a bidirectionally off state. At the time point after a definite time (e.g., 300 μs) has elapsed since the detection point, that is, at the first time point t1, the controller 6 sets the first control signal Sb1 and the second control signal Sb2 to "on" signals.

A second time point t2 is a time point after a lapse of a second time according to the dimming signal from the first time point t1. At the second time point t2, the controller 6 keeps the second control signal Sb2 set to the "on" signal and sets the first control signal Sb1 to an "off" signal. In this way, during a second time period T2 from the first time point t1 to the second time point t2, both the switching devices Q1 and Q2 are on, and the bidirectional switch 2 is in a bidirectionally on state. Thus, during the second time period T2, electric power is supplied from the AC power supply 8 via the bidirectional switch 2 to the load 7, and the load 7 therefore emits light.

A third time point t3 is a time point earlier than an end time point (zero crossing point) t4 of the half period by a definite time (e.g., 300 μs). At the third time point t3, the controller 6 sets the first control signal Sb1 and the second control signal Sb2 to "off" signals. In this way, during a third time period T3 from the second time point t2 to the third time point t3, only the switching device Q1 of the switching devices Q1 and Q2 is off, and the bidirectional switch 2 is in a reverse on state. Thus, during the third time period T3, electric power from the AC power supply 8 to the load 7 is interrupted.

During a fourth time period T4 from the third time point t3 to the end tune point (zero crossing point) t4 of the half period, both the switching devices Q1 and Q2 are off, and the bidirectional switch 2 is in the bidirectionally off state.

Moreover, the operation of the dimming device 1 during the negative half period of the AC voltage Vac is substantially the same as that during the positive half period.

During the negative half period, a time period from a starting time point t0 (t4) of the half period to a first time point t1 after a lapse of a first time is referred to as a first time period T1. Moreover, a second time point t2 is a time point after a lapse of a second time according to the dimming signal from the first time point t1, and a third time point t3 is a time point earlier than an end time point t4 (t0) of the half period by a definite time (e.g., 300 μs).

During the first time period T1, the controller 6 controls such that the first control signal Sb1 and the second control signal Sb2 are "off" signals. Thus, the bidirectional switch 2 is in the bidirectionally off state during the first time period T1. Then, at the first time point t1, the controller 6 sets the first control signal Sb1 and second control signal Sb2 to the "on" signals. In this way, during a second time period T2 from the first time point t1 to the second time point t2, both the switching devices Q1 and Q2 are on, and the bidirectional switch 2 is in a bidirectionally on state. Thus, during the second time period T2, electric power is supplied from the AC power supply 8 via the bidirectional switch 2 to the load 7, and the load 7 therefore emits light.

At the second time point t2, the controller 6 keeps the first control signal Sb1 set to the "on" signal and sets the second control signal Sb2 to an "off" signal. At the third time point t3, the controller 6 sets the first control signal Sb1 and the second control signal Sb2 to "off" signals. In this way, during a third time period T3 from the second time point t2 to a third time point t3, only the switching device Q2 of the switching devices Q1 and Q2 is off, and the bidirectional switch 2 is in the reverse on state. Thus, during the third time period T3, electric power from the AC power supply 8 to the load 7 is interrupted.

The dimming device 1 of the present embodiment alternately repeats the operation during the positive half period and the operation during the negative half period every half period of the AC voltage Vac which are described above to dim the load 7. During the time period from the starting time point (zero crossing point) t0 to the first time point t1 of the half period, the bidirectional switch 2 is in an off state, and during the time period from the second time point t2 to the end time point (zero crossing point) t4 of the half period, the bidirectional switch 2 is in the off state. Thus, when attention is focused on two consecutive half periods, the bidirectional switch 2 is in the off state from the second time point t2 of the first half period to the first time point t1 of the next half period (i.e., the second half period).

Here, since a time (second time) from the first time point t1 to the second time point t2 is a time corresponding to the dimming level input to the inputter 4, a time for which conduction is established between the input terminals 11 and 12 during the half period is determined in accordance with the dimming level. That is, to reduce the light output of the load 7, a short second time is determined, and to increase the light output of the load 7, a long second time is determined. Thus, the magnitude of the light output of the load 7 can be changed in accordance with the dimming level input to the inputter 4. Moreover, since the zero crossing point of the AC voltage Vac is between time periods (the first time period T1 and the fourth time period T4) during which the bidirectional switch 2 is in the bidirectionally off state, the dimming device 1 can secure supplying electric power from the AC power supply 8 to the power supply 5 during these time periods.

(1.3) As to Driver
(1.3.1) Configuration of Driver

The configurations of the first driver 91 and the second driver 92 will be described in further detail. In the following description, a configuration common to the first driver 91 and the second driver 92 is referred to as a "driver 90", and a case where the driver 90 is applied to the first driver 91 is described as an example.

As illustrated in FIG. 2, the driver 90 includes the signal source 910, the discharge part 920, and the filter circuit 930.

Each signal source 910 generates a drive signal Sd1 according to the dimming level. In the present embodiment, the signal source 910 includes an inverter (NOT gate) 911, a resistor R1, and a switching device Q10. A series circuit of the resistor R1 and the switching device Q10 is electrically connected to the drive power supply 52 (see FIG. 1) such that the resistor R1 is on a high-potential (positive-electrode) side and the switching device Q10 is on a low-potential (negative-electrode) side. Thus, the series circuit of the resistor R1 and the switching device Q10 forms a pull-up circuit. For example, the switching device Q10 is a semiconductor switching device including an enhancement n-channel MOSFET. The gate of the switching device Q10 is electrically connected to the controller 6. The switching device Q10 is driven (on/off-controlled) by the first control signal Sb1 from the controller 6.

The inverter 911 has an input terminal electrically connected to a connection point of the resistor R1 and the switching device Q10. Thus, when the switching device Q10 is on, the output of the inverter 911 is at a "High" level, and when the switching device Q10 is off, the output of the inverter 911 is at a "Low" level. Thus, at an output terminal of the inverter 911 as an output terminal of the signal source 910, the drive signal Sd1 of square waveform which is switchable between the "High" level and the "Low" level according to the first control signal Sb1 is generated. When the first control signal Sb1 is at the "High" level, the drive signal Sd1 is at the "High" level, and when the first control signal Sb1 is at the "Low" level, the drive signal Sd1 is at the "Low" level. Here, the first control signal Sb1 at the "High" level corresponds to the "on" signal, and the first control signal Sb1 at the "Low" level corresponds to the "off" signal. The drive electric power from the drive power supply 52 is also supplied to the inverter 911 as electric power for operating the inverter 911.

The discharge part 920 is a series circuit having a Zener diode ZD1 and a rectifier element D9 connected in series. In the present embodiment, the Zener diode ZD1 has a Zener voltage (breakdown voltage) higher than or equal to the threshold voltage Vth1 of the switching device Q1. The rectifier element D9 is a diode having a function of enabling passage of the reverse current of the Zener diode ZD1. That is, the Zener diode ZD1 and the rectifier element D9 are connected to each other in a so-called anti-series connection. Here, the reverse current (of the Zener diode ZD1) is a current flowing in a direction from the cathode of the Zener diode ZD1 toward the anode of the Zener diode ZD1. The Zener diode ZD1 and the rectifier element D9 are electrically connected in series between the output terminal of the signal source 910 (the output terminal of the inverter 911) and the control terminal 20 of the switching device Q1.

In the present embodiment, the Zeiler voltage of the Zener diode ZD1 is a voltage slightly higher than the threshold voltage Vth1. The difference between the Zener voltage and the threshold voltage Vth1 is preferably a value as small as possible and is for example, set to a value within a range from 0 V to 10 V. Moreover, the difference between the Zener voltage and the threshold voltage Vth1 is more preferably higher than or equal to 0.1 V. Moreover, the difference between the Zener voltage and the threshold voltage Vth1 is more preferably lower than or equal to 1 V. Note that considering a forward voltage of the rectifier element D9, the sum of the Zener voltage of the Zener diode ZD1 and the forward voltage of the rectifier element D9 is at least required to be higher than the threshold voltage Vth1. Thus, for example, the Zener voltage of the Zener diode ZD1 may be equivalent to the threshold voltage Vth1, or the Zener voltage may be higher than the threshold voltage Vth1.

The series circuit of the Zener diode ZD1 and the rectifier element D9 is electrically connected between the control terminal 20 and the signal source 910 such that the reverse current of the Zener diode ZD1 flows from the control terminal 20 toward the signal source 910. Specifically, the discharge part 920 including the series circuit of the Zener diode ZD1 and the rectifier element D9 includes a first terminal 921 and a second terminal 922. The first terminal 921 which is on a cathode side of the Zener diode ZD1, that is, on an anode side of the rectifier element D9 is electrically connected to the control terminal 20 of the switching device Q1. The second terminal 922 which is on an anode side of the Zener diode ZD1, that is, on a cathode side of the rectifier element D9 is electrically connected to the output terminal of the signal source 910. In the example of FIG. 2, the rectifier element D9 and the Zener diode ZD1 are aligned in this order in the discharge part 920 from the first terminal 921. The positional relationship between the Zener diode ZD1 and the rectifier element D9 between the first terminal 921 and the second terminal 922 may be reverse to the positional relationship of the example shown in FIG. 2, that is, the Zener diode ZD1 and the rectifier element D9 may be aligned in this order from the first terminal 921.

The filter circuit 930 is electrically connected between the output terminal of the signal source 910 and the control terminal 20 of the switching device Q1 in parallel to the discharge part 920. In the example of FIG. 2, the filter circuit 930 includes a series circuit of a resistor R2 and a capacitive element (capacitor) C2. The series circuit is electrically connected between the output terminal of the signal source 910 and a reference potential point (ground of the power supply 5 in FIG. 1) of the signal source 910. The resistor R2 and the capacitive element C2 are connected such that the resistor R2 is on a high-potential (positive-electrode) side, and the capacitive element C2 is on a low-potential (negative-electrode) side. The connection point of the resistor R2 and the capacitive element C2 is an output terminal of the filter circuit 930 and is electrically connected to the control terminal 20. Thus, the filter circuit 930 serves as an integrating circuit, and the drive signal Sd1 output from the signal source 910 changes a voltage across the capacitive element C2. The voltage across the capacitive element C2 is an output voltage of the filter circuit 930 and is applied between the gate and the source of the switching device Q1 as the gate voltage Vg1.

(1.3.2) Operation of Driver

Figure 4:
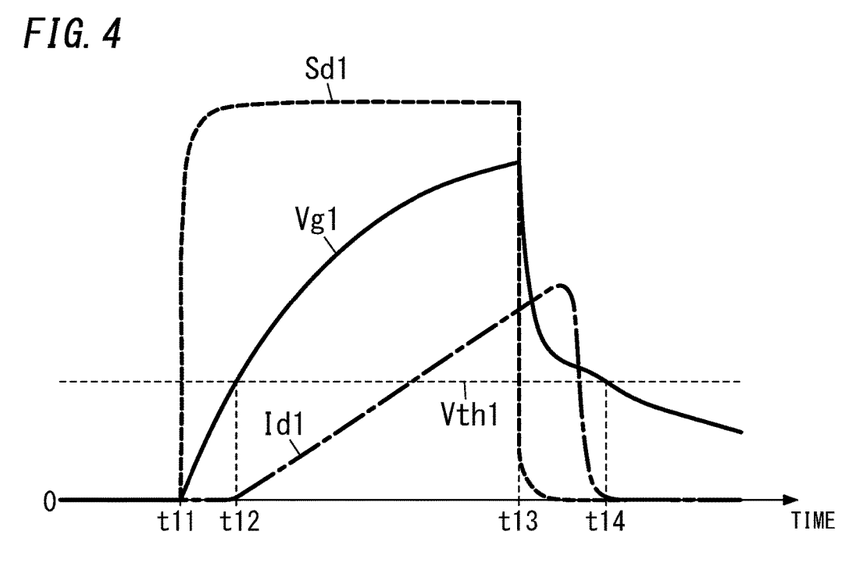
FIG. 4 is a timing chart illustrating the operation of the dimming device according to the first embodiment.

Next, operation of the driver 90 will be described with reference to FIG. 4. Here, description is directed to the operation of the driver 90 in, for example, a case of the level of the drive signal Sd1 changing from "Low" level to "High" level and then to "Low" level. Moreover, it is assumed here that a voltage with the first input terminal 11 having a high potential and the second input terminal 12 having a low potential is applied between the input terminals 11 and 12 (a positive half period of the AC voltage Vac). FIG. 4 shows the drive signal "Sd1", the gate voltage "Vg1", and a drain current (a current flowing between the drain and the source of the switching device Q1) "Id1", wherein the abscissa represents the time axis. For the drive signal Sd1, 0 V corresponds to the "Low" level.

First, in a state where the drive signal Sd1 is at the "Low" level, the gate voltage Vg1 has substantially 0 V, and thus the switching device Q1 is off.

When the drive signal Sd1 transitions from the "Low" level to the "High" level (time t11), the capacitive element C2 is started to be charged, and as time passes, the gate voltage Vg1 gradually increases. At this time, the gate voltage Vg1 moderately increases due to the filter circuit 930. The charge rate of the capacitive element C2 at this time, that is, the inclination of the gate voltage Vg1 depends on the time constant of the filter circuit 930. When the gate voltage Vg1 becomes higher than or equal to the threshold voltage Vth1 of the switching device Q1 (time t12), the switching device Q1 is turned on. When the switching device Q1 is turned on, the drain current Id1 starts flowing between the drain and the source of the switching device Q1. Since the discharge part 920 includes the rectifier element D9, a current does not flow to the discharge part 920 with the drive signal Sd1 being at the "High" level.

When the drive signal Sd1 transitions from the "High" level to the "Low" level (time t13), the capacitive element C2 of the filter circuit 930 is started to be discharged. According to the driver 90 of the present embodiment, electric charges of the capacitive element C2 are rapidly discharged through the discharge part 920 immediately after the drive signal Sd1 transitions to the "Low" level, so that the gate voltage Vg1 sharply decreases.

That is, when the drive signal Sd1 transitions to the "Low" level, the voltage across the capacitive element C2 is applied to both ends of the discharge part 920, that is, between the first terminal 921 and the second terminal 922. Directly after the drive signal Sd1 transitions to the "Low" level, the gate voltage Vg1 of the switching device Q1, that is, the voltage across the capacitive element C2 is higher than at least the threshold voltage Vth1 of the switching device Q1. Thus, a voltage higher than the threshold voltage Vth1 is applied between the first terminal 921 and the second terminal 922 of the discharge part 920, and a voltage higher than or equal to the Zener voltage is applied to the Zener diode ZD1. Thus, the Zener diode ZD1 is turned on (becomes conductive) to form a discharge path of the capacitive element C2 by the discharge part 920. Thus, the electric charges of the capacitive element C2 are rapidly discharged through the rectifier element D9 and the Zener diode ZD1, and the gate voltage Vg1 sharply decreases. When the voltage applied to the Zener diode ZD1 decreases below the Zener voltage as the gate voltage Vg1 decreases, the Zener diode ZD1 is turned off (becomes non-conductive).

At or after the time point at which the Zener diode ZD1 is turned off, the gate voltage Vg1 gradually decreases as time passes. At this time, the gate voltage Vg1 moderately decreases due to the filter circuit 930. That is, turning off of the Zener diode ZD1 causes the discharge path of the capacitive element C2 by the discharge part 920 to disappear, and therefore, the gate voltage Vg1 moderately decreases at or after the turning off of the Zener diode ZD1. The discharge rate of the capacitive element C2, that is, the inclination of the gate voltage Vg1 at or after the time point at which the Zener diode ZD1 is turned off depends on the time constant of the filter circuit 930. When the gate voltage Vg1 decreases below the threshold voltage Vth1 of the switching device Q1 (time t14), the switching device Q1 is turned off, so that the drain current Id1 no longer flows.

As described above, according to the driver 90 of the present embodiment, the gate voltage Vg1 sharply decreases immediately after the drive signal Sd1 transitions from the "High" level to the "Low" level. Then, before the gate voltage Vg1 decreases below the threshold voltage Vth1, the inclination of the gate voltage Vg1 changes and becomes moderate. In sum, the Zener voltage of the Zener diode ZD1 is set slightly higher than the threshold voltage Vth1, and therefore, the Zener diode ZD1 is turned off before the gate voltage Vg1 decreases below the threshold voltage Vth1, and the rapid discharge through the discharge part 920 ends.

(1.3.3) Comparison With Comparative Example

A dimming device including a driver having a configuration in which the discharge part 920 is omitted from the configuration of the driver 90 of the present embodiment is hereinafter defined as a comparative example, and the driver 90 of the present embodiment and the driver of the comparative example are compared with each other to describe differences between the driver 90 of the present embodiment and the driver of the comparative example. The comparative example shown herein is different from the present embodiment in that the discharge part is not provided, but the other circuit configurations of the comparative example are the same as those of the present embodiment, and thus, components similar to those of the present embodiment will be described hereinafter by using the same reference signs as those in the present embodiment.

Figure 5A:
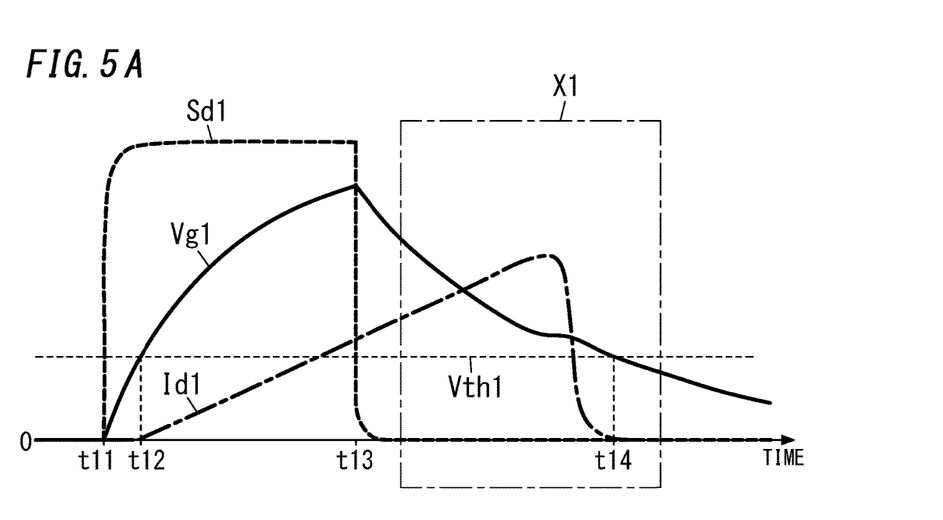
FIG. 5A is a timing chart illustrating operation of a comparative example.

Similarly to FIG. 4, FIG. 5A shows operation of the driver of the comparative example, wherein a drive signal Sd1 changes from "Low" level to "High" level and then to "Low" level. In FIG. 5A, the drive signal "Sd1", the gate voltage "Vg1", and a drain current (a current flowing between the drain and the source of the switching device Q1) "Id1" are shown, wherein the abscissa represents the time axis.

In the comparative example, when the drive signal Sd1 transitions from the "High" level to the "Low" level (time t13), a capacitive element C2 of a filter circuit 930 is started to be discharged. Since the driver of the comparative example includes no discharge path of the capacitive element C2 by the discharge part, the gate voltage Vg1 gradually decreases as time passes immediately after the drive signal Sd1 transitions to the "Low" level. At this time, the gate voltage Vg1 moderately decreases due to the filter circuit 930. The discharge rate of the capacitive element C2 at this time, that is, the inclination of the gate voltage Vg1 depends on the time constant of the filter circuit 930. When the gate voltage Vg1 decreases below the threshold voltage Vth1 of the switching device Q1 (time t14), the switching device Q1 is turned off, so that the drain current Id1 no longer flows.

That is, in the comparative example, the influence of the filter circuit 930 increases a time (time t13 to time t14) required to interrupt the drain current Id1 after the drive signal Sd1 transitions to the "Low" level. In other words, a delay time (time lag) from reception of the first control signal Sb1 by the driver to performing off control of the switching device Q1 increases. For example, when the dimming level is reduced to be close to a minimum level, a time for which the bidirectional switch 2 is in an on state is reduced, thereby increasing the ratio of the delay time to the time period during which the bidirectional switch 2 is in the on state. In this case, a delay in responding so as to perform the off control of the switching device Q1 becomes significant, the responsiveness of the light output of the load 7 to the dimming level decreases, and the light output desired by a user may not be able to be realized.

Figure 5B:
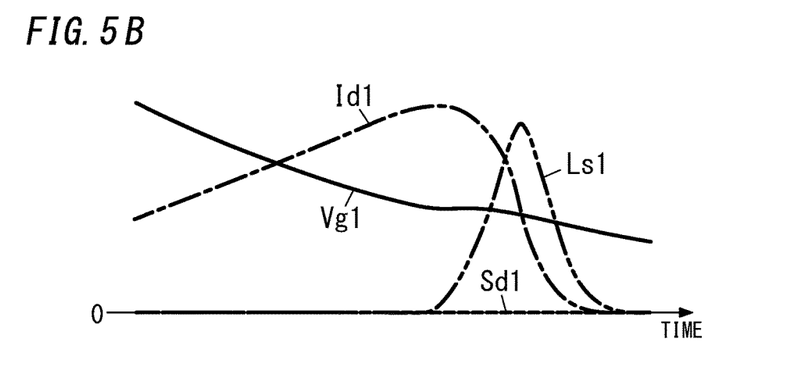
FIG. 5B is a timing chart illustrating an area X1 of FIG. 5A enlarged in a time-axis direction.

Moreover, in the comparative example, a switching loss Ls1 as shown in FIG. 5B may occur in the switching device Q1. FIG. 5B shows the area denoted by "X1" in FIG. 5A, wherein the area is enlarged in the time-axis direction, and the switching loss Ls1 is also shown. That is, in the comparative example, a long time is required to interrupt the drain current Id1 after the drive signal Sd1 transitions to the "Low" level so as to turn off the switching device Q1. Thus, the switching loss Ls1 generated during this time has a relatively large time integration value.

In contrast, the present embodiment includes the discharge part 920, and thus, as illustrated in FIG. 4, a time (time t13 to time t14) required to interrupt the drain current Id1 after the drive signal Sd1 transitions to the "Low" level is reduced. Thus, the delay time from reception of the first control signal Sb1 by the driver 90 to performing the off control of the switching device Q1 is reduced. This improves the responsiveness of the light output of the load 7 to the dimming level. Moreover, the present embodiment also reduces the switching loss which occurs in the switching device Q1 when the switching device Q1 is turned off.

In addition, the Zener voltage of the Zener diode ZD1 of the discharge part 920 is set slightly higher than the threshold voltage Vth1, and therefore, when the switching device Q1 is turned off, the rapid discharge through the discharge part 920 ends before the gate voltage Vg1 decreases below the threshold voltage Vth1. Thus, at a time point at which the gate voltage Vg1 reaches the threshold voltage Vth1, the filter circuit 930 functions and the drain current Id1 moderately changes, and therefore, a noise reduction effect by the filter circuit 930 can be expected.

When the "first control signal Sb1" and the "switching device Q1" in the description of the driver 90 are respectively replaced with a "second control signal Sb2" and a "switching device Q2", the description results in description of a case where the driver 90 is applied to a second driver 92.

(1.4) Advantages

The dimming device 1 of the present embodiment includes the discharge part 920, and therefore, immediately after the drive signal Sd1 generated by the signal source 910 transitions to the "Low" level, the gate voltage Vg1 can be sharply reduced. Thus, as compared to the case where the discharge part 920 is not included, the delay time in the off control of each of the switching devices Q1 and Q2 is reduced. This improves the responsiveness of the light output of the load 7 to the dimming level. Moreover, the switching loss is also reduced. Thus, the dimming device 1 of the present embodiment provides compatibility with an increased number of types of loads.

Moreover, as the present embodiment, the sum of the Zener voltage of the Zener diode ZD1 and the forward voltage of the rectifier element D9 is preferably higher than the threshold voltage Vth1. With this configuration, a sharp decrease of the gate voltage Vg1 can be stopped before the gate voltage Vg1 decreases below the threshold voltage Vth1.

The reverse current of the Zener diode ZD1 is a current which flows in a direction from the cathode of the Zener diode ZD1 toward the anode of the Zener diode ZD1. Here, as the present embodiment, the first terminal 921 on the cathode side of the Zener diode ZD1 of the series circuit is preferably electrically connected to the control terminal 20. The second terminal 922 on the anode side of the Zener diode ZD1 of the series circuit is preferably electrically connected to the signal source 910. With this configuration, the series circuit of the Zener diode ZD1 and the rectifier element D9 enables the reverse current of the Zener diode ZD1 to flow from the control terminal 20 to the signal source 910 between the control terminal 20 and the signal source 910.

Moreover, as the present embodiment, the dimming device 1 preferably further includes the filter circuit 930 between the signal source 910 and the control terminal 20, and the filter circuit 930 is electrically connected in parallel to the discharge part 920. With this configuration, during a time period during which the discharge part 920 is non-conductive, the change in the gate voltage Vg1 becomes moderate, and the drain current Id1 changes moderately, and therefore, it is possible to reduce noise. The filter circuit 930 in the present embodiment is not an essential element of the dimming device 1, and thus, the filter circuit 930 may be omitted accordingly. When the filter circuit 930 is omitted, the discharge part 920 forms, for example, a discharge path of a gate capacitance (parasitic capacitance) of each of the switching devices Q1 and Q2.

(1.5) Variation (1.5.1) First Variation

Figure 6:
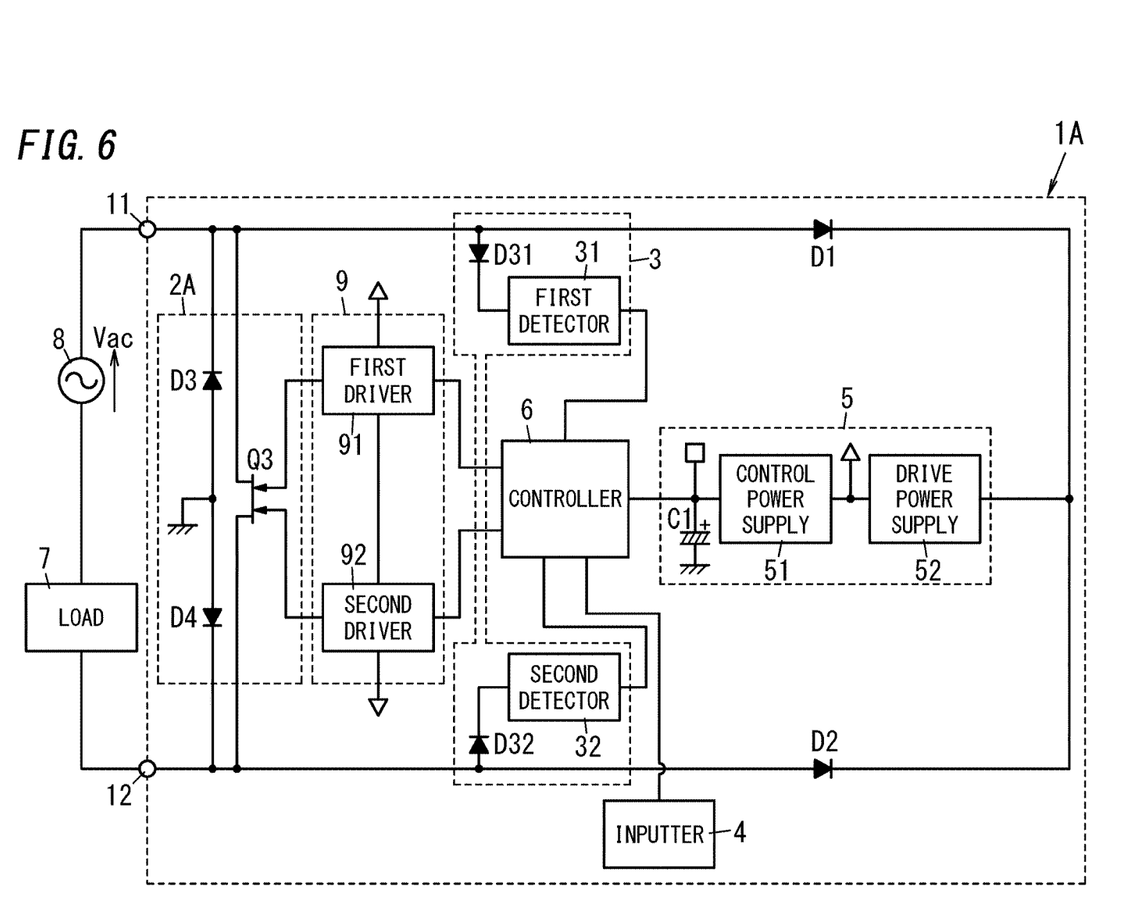
FIG. 6 is a circuit diagram schematically illustrating a configuration of a dimming device according to a first variation of the first embodiment.

As illustrated in FIG. 6, a bidirectional switch 2A of a dimming device 1A according to a first variation of the first embodiment is different from the bidirectional switch 2 of the dimming device 1 of the first embodiment. Components similar to those in the first embodiment are hereinafter denoted by the same reference signs as those in the first embodiment, and the description thereof will be omitted accordingly.

In the present variation, the bidirectional switch 2A includes a switching device Q3 having a double gate structure. The switching device Q3 is a semiconductor element having a double gate (dual gate) structure including a semiconductor material of a wide band gap such as gallium nitride (GaN). Moreover, the bidirectional switch 2A includes a pair of diodes D3 and D4 connected to each other in a so-called anti-series connection between input terminals 11 and 12. The cathode of the diode D3 is connected to the input terminal 11, and the cathode of the diode D4 is connected to the input terminal 12. The anodes of both the diodes D3 and D4 are electrically connected to ground of a power supply 5. In the present variation, the pair of diodes D3 and D4 and a pair of diodes D1 and D2 together form a diode bridge.

According to the configuration of the present variation, the bidirectional switch 2A can reduce the conduction loss more than the bidirectional switch 2.

(1.5.2) Other Variations

Variations of the first embodiment other than the above-described first variation will be mentioned below.

The dimming device of each of the above-described first embodiment and the first variation is applicable not only to the load 7 using an LED device as a light source but also a light source including a capacitor input-type circuit, having a high impedance, and being lit with a small current. Examples of such a light source include an organic electroluminescence (EL) element. Moreover, the dimming device is applicable to loads 7 of various light sources such as a discharge lamp.

The bidirectional switch 2 may be controlled to be in a "forward on state" instead of a "bidirectionally on state" or in contrast, the bidirectional switch 2 may be controlled to be in the "bidirectionally on state" instead of the "forward on state". Moreover, the bidirectional switch 2 may be controlled to be in a "reverse on state" instead of the "bidirectionally off state" or may be controlled to be in the "bidirectionally off state" instead of the "reverse on state". That is, it is required only that the state, namely the on state or the off state, of the bidirectional switch 2 does not change.

Moreover, a control method of the bidirectional switch 2 by the controller 6 is not limited to the above-described examples, and may be, for example, a method for alternately setting the first control signal and the second control signal to the "on" signal at the same cycle as the AC voltage Vac. In this case, the bidirectional switch 2 is conductive during a time period during which one of the switching devices Q1 and Q2 corresponding to a high-potential side of the AC voltage Vac is on. That is, this variation realizes so-called reverse phase control for establishing conduction between the pair of input terminals 11 and 12 during a time period from the zero crossing point of the AC voltage Vac to a time point during the half period. In this case, a phase difference between the first control signal and the second control signal and the AC voltage Vac are controlled to adjust conduction time of the bidirectional switch 2.

Moreover, the control method is not limited to the reverse phase control method (trailing edge method) but may be a normal phase control method (leading edge method). The normal phase control method establishes conduction between the pair of input terminals 11 and 12 during a time period from a time point during the half period of the AC voltage Vac to the zero crossing point.

Moreover, each of the switching devices Q1 and Q2 included in the bidirectional switch 2 is not limited to an enhancement n-channel MOSFET but may be, for example, an insulated gate bipolar transistor (IGBT). Moreover, in the bidirectional switch 2, the rectifier element (diode) for realizing the unidirectionally on state is not limited to the parasitic diodes of the switching devices Q1 and Q2 but may be an external diode such as those described in the first variation. The diode may be accommodated in an identical package with each of the switching devices Q1 and Q2.

Moreover, the first time is required only to be a certain length of time period, and the length of the first time can be accordingly set. For example, when a sum of: a time period from a starting time point (zero crossing point) t0 of the half period to a detection point; and a time period from the detection point until a certain stand-by time elapses corresponds to the first time period T1, the stand-by time is not limited to 300 μs but is accordingly set to a value within a range from 0 μs to 500 μs.

Moreover, the third time point t3 is required only to be before the end time point (zero crossing point) t4 of the half period, and the length from the third time point t3 to the end time point t4 of the half period can be accordingly determined. For example, when the time length from the detection point to the third time point t3 is shorter than the half period by a certain first specified time, the first specified time is not limited to 300 μs but may be accordingly set to a value within a range from 100 μs to 500 μs.

The diodes D1 and D2 in the first embodiment are not essential elements of the dimming device 1, and thus, the diodes D1 and D2 may be accordingly omitted.

Moreover, in comparison between two values such as the gate voltage Vg1 and the threshold voltage Vth1, "larger than or equal to" includes both a case where the two values are equal to each other and a case where one of the two values is larger than the other of the two values. However, the meaning of the "larger (higher) than or equal to" mentioned herein is not limited to the above definition but "larger (higher) than or equal to" mentioned herein may be a synonym of "larger (higher) than" which includes only a case where one of the two values is larger than the other of the two values. Similarly, "larger (higher) than" mentioned herein may be a synonym of "larger (higher) than or equal to" which includes both a case where the two values are equal to each other and a case where one of the two values is larger than the other of the two values. That is, whether or not a case where the two values are equal to each other is included can be arbitrarily changed depending on the setting of the threshold voltage Vth1 and the like, and therefore, there is no technical difference between "larger (higher) than or equal to" and "larger (higher) than". Similarly, "lower than" may be a synonym of "lower than or equal to".

Second Embodiment

Figure 7:
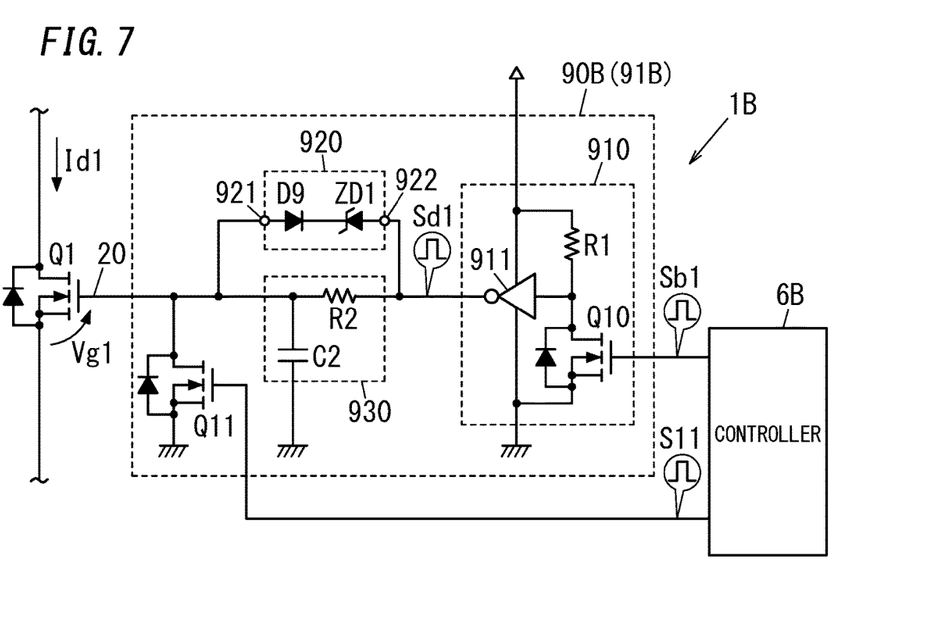
FIG. 7 is a circuit diagram schematically illustrating a configuration of a driver of a dimming device according to a second embodiment.

As illustrated in FIG. 7, a dimming device 1B of a second embodiment is different from the dimming device 1 of the first embodiment in that an auxiliary switch Q11 is further provided. The auxiliary switch Q11 is configured to switch between conduction and non-conduction between a control terminal 20 and a reference potential point of a signal source 910. In FIG. 7, similarly to FIG. 2 showing the first embodiment, a configuration common to a first driver and a second driver is referred to as a "driver", and a case where a driver 90B is applied to a first driver 91B is shown. Components similar to those in the first embodiment are hereinafter denoted by the same reference signs as those in the first embodiment, and the description thereof will be omitted accordingly.

In the present embodiment, the auxiliary switch Q11 is, for example, a semiconductor switching device including an enhancement n-channel MOSFET. The drain of the auxiliary switch Q11 is connected to the control terminal 20 of a switching device Q1, and the source of the auxiliary switch Q11 is connected to a reference potential point (ground of a power supply 5) of the signal source 910. That is, the auxiliary switch Q11 is connected in parallel between the gate and the source of the switching device Q1. The gate of the auxiliary switch Q11 is electrically connected to a controller 6B. The auxiliary switch Q11 is driven (on/off controlled) by a first auxiliary signal S11 from the controller 6B. The auxiliary switch Q11 is not limited to the enhancement n-channel MOSFET but may be, for example, an IGBT.

The auxiliary switch Q11 is configured to be turned on with a delay of a definite time (hereinafter referred to as a "second specified time") from a fall of a drive signal Sd1. Specifically, a rise of the first auxiliary signal S11 which drives the auxiliary switch Q11 is set with a delay of the second specified time from the fall of the drive signal Sd1. The second specified time is determined within a range from 0 μs to 500 μs, and is set, for example, to 200 μs. Here, a time delay of the first auxiliary signal S11 is set by, for example, a timer of the controller 6B.

It is not limited to a configuration that the first auxiliary signal S11 which drives the auxiliary switch Q11 is generated by the controller 6B. For example, a delay circuit may be provided in addition to the controller 6B, and the delay circuit may generate the first auxiliary signal S11 which rises with a delay of a definite time from a fall of a first control signal Sb1 or the drive signal Sd1 output by the controller 6B.

Figure 8A:
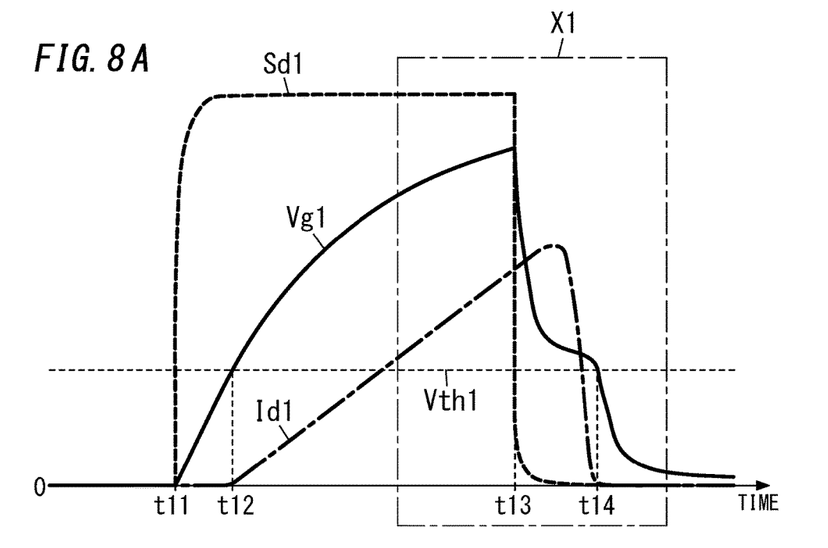
FIG. 8A is a timing chart illustrating operation of the dimming device according to the second embodiment.
Figure 8B:
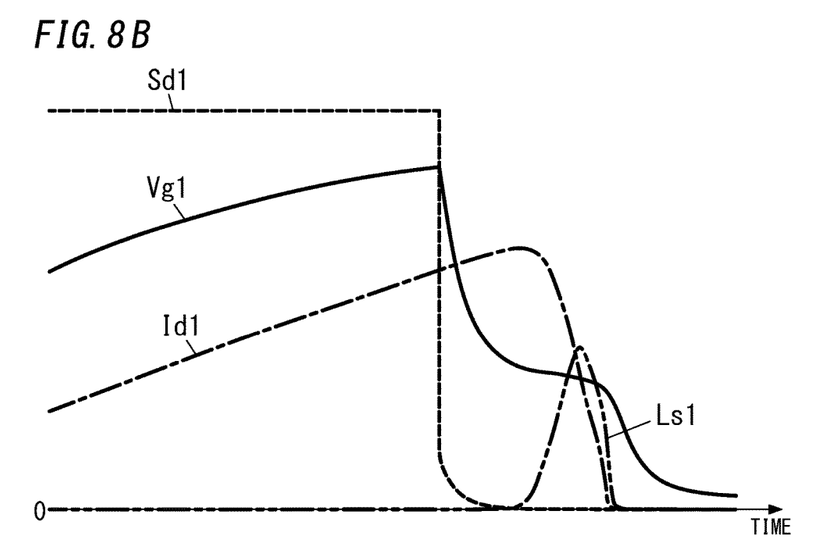
FIG. 8B is a timing chart illustrating an area X1 of FIG. 8A enlarged in a time-axis direction.

Next, with reference to FIGS. 8A and 8B, operation of the driver 90B of present embodiment will be described. Similarly to FIG. 4 showing the first embodiment, FIG. 8A is a view illustrating the operation of the driver 90B in a case of the level of the drive signal Sd1 changing from "Low" level to "High" level and then to "Low" level. In FIG. 8B, the drive signal "Sd1", a gate voltage "Vg1", and a drain current "Id1" are shown, wherein the abscissa represents the time axis. For the drive signal Sd1, 0 V corresponds to the "Low" level.

When the drive signal Sd1 transitions from the "High" level to the "Low" level (time t13), the capacitive element C2 of the filter circuit 930 is started to be discharged.

According to the driver 90B of the present embodiment, the capacitive element C2 is rapidly discharged through a discharge part 920 immediately after the drive signal Sd1 transitions to the "Low" level, so that the gate voltage Vg1 sharply decreases. Then, before the gate voltage Vg1 decreases below the threshold voltage Vth1, turning off of the Zener diode ZD1 causes the discharge path of the capacitive element C2 by the discharge part 920 to disappear, and therefore, the inclination of the gate voltage VQ1 changes and becomes moderate. When the gate voltage Vg1 decreases below the threshold voltage Vth1 of the switching device Q1 (time t14), the switching device Q1 is turned off, so that the drain current Id1 no longer flows.

Moreover, in the present embodiment, when the second specified time has elapsed since the time point (time t13) at which the drive signal Sd1 transitioned to the "Low" level, the auxiliary switch Q11 is turned on by the first auxiliary signal S11. When the auxiliary switch Q11 is turned on, conduction is established between the control terminal 20 and the reference potential point of the signal source 910 to form a discharge path of the capacitive element C2 by the auxiliary switch Q11. Thus, electric charges remaining in the capacitive element C2 are rapidly discharged through the auxiliary switch Q11, so that the gate voltage Vg1 sharply decreases.

FIG. 8B shows the area denoted by "X1" in FIG. 8A, wherein the area is enlarged in the time-axis direction, and a switching loss Ls1 of the switching device Q1 is added. That is, in the present embodiment, a time required to interrupt the drain current Id1 after the drive signal Sd1 transitions to the "Low" level so as to turn off the switching device Q1 is shorter than that in the first embodiment. Thus, a time integration value of the switching loss Ls1 which occurs during this time is decreased more than in the first embodiment.

When the "first control signal Sb1" and the "switching device Q1" in the description of the driver 90B are respectively replaced with a "second control signal Sb2" and a "switching device Q2", the description results in description of a case where the driver 90B is applied to a second driver 92.

As described above, the dimming device 1B of the present embodiment further includes an auxiliary switch Q11 configured to switch between conduction and non-conduction between the control terminal 20 and the reference potential point of the signal source 910. Thus, according to the present embodiment, after a state where the gate voltage Vg1 sharply decreases due to the discharge part 920 transitions to a state where the gate voltage Vg1 moderately decreases, further transition to a state where the gate voltage Vg1 sharply decreases is possible. Thus, a time lag for off control of each of switching devices Q1 and Q2 is more reduced and the responsiveness of the light output of the load 7 to the dimming level is more improved than in a case where the auxiliary switch Q11 is not provided. Moreover, the switching loss is also reduced.

Moreover, as in the present embodiment, the auxiliary switch Q11 is preferably configured to be turned on with a delay of a definite time (second specified time) from the fall of the drive signal Sd1. With this configuration, the responsiveness for the off control of each of the switching devices Q1 and Q2 can be arbitrarily set at a control timing of the auxiliary switch Q11.

Other configurations and functions are similar to those of the first embodiment. The configuration of the present embodiment is applicable in combination with each of the configurations described in the first embodiment (including the variations).

Other Embodiments

In each of the above-described first embodiment (including the variations) and the second embodiment, an electric power supply from the AC power supply 8 to the power supply 5 is secured over periods (the first time period T1 and the fourth time period T4) before and after the starting time point (zero crossing point) t0 of the half period of the AC voltage Vac, but the above-described embodiments are not limited to this configuration.

Only during a period (the first time period T1) after the starting time point (zero crossing point) t0 of the half period of the AC voltage Vac, the electric power supply from the AC power supply 8 to the power supply 5 may be secured for a definite time. Moreover, only during a period (the fourth time period T4) before the starting time point (zero crossing point) t0 of the half period of the AC voltage Vac, the electric power supply from the AC power supply 8 to the power supply 5 may be secured for a definite time. That is, during at least one of the first time period T1 and the fourth time period T4, the electric power supply from the AC power supply 8 to the power supply 5 can be secured. Note that when a user operates the operation section so as to maximize the light output of the load 7, securing the first time period T1 and the fourth time period T4 is prioritized, and the second time period T2 may be controlled to be a time period shorter than a length at which the light output is maximized.

Setting the definite time to be sufficient for the electric power supply from the AC power supply 8 to the power supply 5 enables a stable operation of the controller 6 while reducing the distortion of the current waveform.

REFERENCE SIGNS LIST 1, 1A, 1B Dimming Device
4 Inputter
6, 6B Controller
7 Load (Illumination Load)
8 AC Power Supply
11 Input Terminal
12 Input Terminal
20 Control Terminal
910 Signal Source
920 Discharge Part
921 First Terminal
922 Second Terminal
930 Filter Circuit
C1 Capacitive Element
D9 Rectifier Element
Q1 Switching Device
Q2 Switching Device
Q3 Switching Device
Q11 Auxiliary Switch
Sd1 Drive Signal
Vth1 Threshold Voltage
ZD1 Zener Diode

The invention claimed is:

1. A dimming device, comprising:
a pair of input terminals electrically connected between an illumination load and an AC power supply;
a switching device including a control terminal and configured to switch between non-conduction and conduction of a bidirectional current between the pair of input terminals depending on whether or not a voltage applied to the control terminal is higher than or equal to a threshold voltage;
an inputter configured to receive a dimming level specifying a magnitude of a light output of the illumination load;
a signal source configured to generate a drive signal according to the dimming level; and
a discharge part including a series circuit having a Zener diode and a rectifier element connected in series to each other, the series circuit enabling passage of a reverse current of the Zener diode, and the series circuit being electrically connected between the control terminal and the signal source to enable the reverse current to flow from the control terminal to the signal source, wherein
a sum of a Zener voltage of the Zener diode and a forward voltage of the rectifier element is higher than the threshold voltage.

2. The dimming device according to claim 1, wherein
the reverse current is a current which flows in a direction from a cathode of the Zener diode toward an anode of the Zener diode, and
the series circuit includes:
a first terminal on a cathode side of the Zener diode of the series circuit, the first terminal being electrically connected to the control terminal; and
a second terminal on an anode side of the Zener diode of the series circuit, the second terminal being electrically connected to the signal source.

3. The dimming device according to claim 1, further comprising:
a filter circuit between the signal source and the control terminal, the filter circuit being electrically connected in parallel to the discharge part.

4. The dimming device according to claim 1, further comprising:
an auxiliary switch configured to switch between conduction and non-conduction between the control terminal and a reference potential point of the signal source.

5. The dimming device according to claim 4, wherein
the auxiliary switch is configured to be turned on with a delay of a definite time from a fall of the drive signal.

6. The dimming device according to claim 1, wherein
the reverse current is a current which flows in a direction from a cathode of the Zener diode toward an anode of the Zener diode, and
the series circuit includes:
a first terminal on a cathode side of the Zener diode of the series circuit, the first terminal being electrically connected to the control terminal; and
a second terminal on an anode side of the Zener diode of the series circuit, the second terminal being electrically connected to the signal source.

7. The dimming device according to claim 1, further comprising:
a filter circuit between the signal source and the control terminal, the filter circuit being electrically connected in parallel to the discharge part.

8. The dimming device according to claim 2, further comprising:
a filter circuit between the signal source and the control terminal, the filter circuit being electrically connected in parallel to the discharge part.

9. The dimming device according to claim 6, further comprising:
a filter circuit between the signal source and the control terminal, the filter circuit being electrically connected in parallel to the discharge part.

10. The dimming device according to claim 1, further comprising:
an auxiliary switch configured to switch between conduction and non-conduction between the control terminal and a reference potential point of the signal source.

11. The dimming device according to claim 2, further comprising:
an auxiliary switch configured to switch between conduction and non-conduction between the control terminal and a reference potential point of the signal source.

12. The dimming device according to claim 3, further comprising:
an auxiliary switch configured to switch between conduction and non-conduction between the control terminal and a reference potential point of the signal source.

13. The dimming device according to claim 6, further comprising:
an auxiliary switch configured to switch between conduction and non-conduction between the control terminal and a reference potential point of the signal source.

14. The dimming device according to claim 7, further comprising:
an auxiliary switch configured to switch between conduction and non-conduction between the control terminal and a reference potential point of the signal source.

15. The dimming device according to claim 8, further comprising:
an auxiliary switch configured to switch between conduction and non-conduction between the control terminal and a reference potential point of the signal source.

16. The dimming device according to claim 9, further comprising:
an auxiliary switch configured to switch between conduction and non-conduction between the control terminal and a reference potential point of the signal source.

17. The dimming device according to claim 10, wherein the auxiliary switch is configured to be turned on with a delay of a definite time from a fall of the drive signal.

18. The dimming device according to claim 11, wherein the auxiliary switch is configured to be turned on with a delay of a definite time from a fall of the drive signal.

19. The dimming device according to claim 12, wherein the auxiliary switch is configured to be turned on with a delay of a definite time from a fall of the drive signal.

* * * * *